(12) United States Patent
Lindstedt

(10) Patent No.: US 6,430,428 B1
(45) Date of Patent: Aug. 6, 2002

(54) IMAGING SYSTEM FOR A MEDICAL DIAGNOSTIC APPARATUS

(75) Inventor: Werner Lindstedt, Kalchreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/065,055
(22) PCT Filed: Oct. 16, 1996
(86) PCT No.: PCT/DE96/01961
§ 371 (c)(1),
(2), (4) Date: Jul. 23, 1998
(87) PCT Pub. No.: WO97/15840
PCT Pub. Date: May 1, 1997

(30) Foreign Application Priority Data

Oct. 25, 1995 (DE) .......................... 195 39 712
Oct. 25, 1995 (DE) .......................... 195 39 713

(51) Int. Cl.$^7$ .............................. A61B 5/055
(52) U.S. Cl. ........................ 600/410; 324/314
(58) Field of Search .................. 600/407, 410, 600/437; 128/920, 922; 324/309, 312, 314

(56) References Cited

U.S. PATENT DOCUMENTS

| | | | |
|---|---|---|---|
| 4,835,690 A | | 5/1989 | Gangarosa et al. |
| 5,144,242 A | | 9/1992 | Zeilenga et al. |
| 5,349,296 A | | 9/1994 | Cikotte et al. |
| 5,514,962 A | * | 5/1996 | Cline et al. ............ 324/309 |
| 5,584,293 A | * | 12/1996 | Darrow et al. ......... 128/653.2 |
| 5,736,857 A | * | 4/1998 | Taft ..................... 324/309 |
| 5,838,906 A | * | 11/1998 | Doyle et al. |
| 5,919,138 A | * | 7/1999 | Ustuner |
| 5,947,900 A | * | 9/1999 | Derbyshire et al. ..... 600/410 |
| 5,995,864 A | * | 11/1999 | Wessol et al. ......... 600/436 |
| 6,014,581 A | * | 1/2000 | Whayne et al. ........ 600/523 |
| 6,144,201 A | * | 11/2000 | Miyazaki ............... 324/306 |
| 6,166,544 A | * | 12/2000 | Debbins et al. ........ 324/309 |
| 6,275,721 B1 | * | 8/2001 | Darrow et al. ......... 600/410 |

FOREIGN PATENT DOCUMENTS

DE  OS 38 13 553  11/1988
DE  PS 43 37 161  3/1995

OTHER PUBLICATIONS

"Bildgebende Systeme für die medizinische Diagnostik," Krestel, pp. 430–445, 479–481.
"Software and Hardware Integration of a Microprogrammable State Machine for NMR Imaging," Stewart et al., Magnetic Resonance Imaging, vol. 5, pp. 627–634 (1991).
Patent Abstracts of Japan, vol. 13, No. 82 (P-833), for Japanese Application No. JP870099336.

* cited by examiner

Primary Examiner—Marvin M. Lateef
Assistant Examiner—Shawna J. Shaw
(74) Attorney, Agent, or Firm—Schiff Hardin & Waite

(57) ABSTRACT

A medical diagnostic apparatus has a computer, a bus, processors, memories and an input arrangement, the imput arrangement including an adjustment arrangement for the nearly simultaneous adjustment of at least two input parameters, to which a processor is allocated for conversion into control parameters.

18 Claims, 1 Drawing Sheet

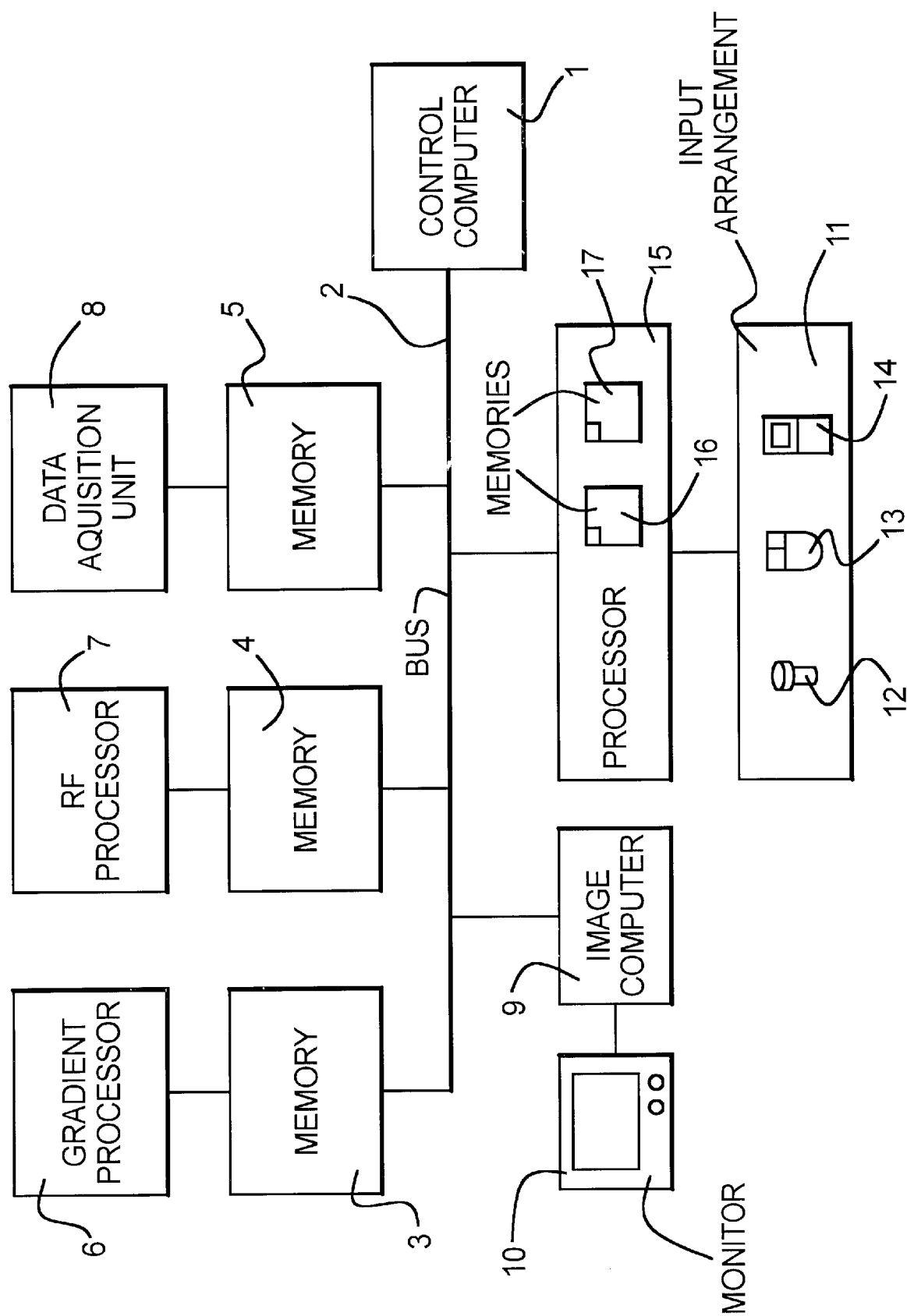

IMAGING SYSTEM FOR A MEDICAL DIAGNOSTIC APPARATUS

BACKGROUND OF THE INVENTION

1. Field of the Invention

The present invention relates to a magnetic resonance system of the type having an imaging computer, an image acquisition unit, a control arrangement including a computer, a bus, processors and memories, and having an input arrangement for the manual entry of sequence parameters.

2. Description of the Prior Art

In conventional examinations, e.g. in magnetic resonance (MR), before the measurement a control sequence, e.g. spin echo or turbo spin echo, is selected, and is modified by entering user parameters (UIPar=User Interface Parameter). In MR technology, user parameters (UIPar) of this sort can be the repetition time TR, the echo times TE or TE(i), the number of slices, the slice thicknesses, the matrix size, the image segment FOV (Field of View), the slice position, the slice rotation, the flip angle, and the saturation slices.

From the sequence and the UI parameters, data sets and/or programs are calculated that are loaded into the control hardware and are interpreted there. The control hardware basically is formed by the gradient generator, the RF generator and the data recording.

At the end of the measurement, or accompanying the measurement, the raw data are evaluated, or during the imaging magnetic resonance (MRI) images of arbitrarily rotated slices through the subject of examination are calculated. If modifications are desired, the UI parameters must subsequently be re-entered, and the sequence begins again.

The entry of the parameters has previously taken place on the display screen via an input mask in which there are provided fields for alphanumeric text or numbers, fields to be marked with a cross, or slides, on which an analog input is possible with the aid of a mouse.

Given a graphical slice positioning, the user selects a slice and moves it in parallel fashion or rotates it by setting the cursor to what are called angle points, and these are then moved.

This sort of input is inconvenient, especially if inputs are made during measurement and their effects are supposed to be observed quasi-simultaneously with the input. It is then not realistic to expect that a display screen mask and the MR images can be observed at the same time. Moreover, it is very inconvenient to place the cursor precisely on an input field, or even an angle point, using the mouse.

In U.S. Pat. No. 5,144,242, a microcoded pulse sequencer for real-time controlling of an MR system is specified in which microcommands from one memory region are loaded into another region.

U.S. Pat. No. 5,349,296 relates to an MR apparatus that is controlled by a workstation. For the reproduction of an image reconstructed from the magnetic resonance data, a scan processor is provided that controls the scan parameters and the reconstruction processor. A scan sequencer contains a master board for microcode, which controls the scan processor dependent on the commands of the scan processor. A number of codes describing the gradients and the RF pulse form is read into a memory. Dependent on a clock rate, the data are read into corresponding output registers step-by-step.

From the journal "Magnetic Resonance Imaging," vol. 9 (1991), pages 627–634, an apparatus is known that can be used as an MR pulse programmer. It produces a microcode in the shortest time and transmits these data.

SUMMARY OF THE INVENTION

An object of the present invention is to provide of creating an imaging system of the type described above that enables a simple and rapid change between the various parameters, as well as a simple and rapid entry of the parameters. The above object is achieved in accordance with the principles of the present invention in a magnetic resonance system having an image computer, an image acquisition unit, a control arrangement including a control computer, a bus and processors and memories, and an imput arrangement for manually entering sequence parameters, the imput arrangement including an adjustment arrangement which allows sequence parameters to be directly modified online during an examination sequence. By means of this online MR sequence modification, the measurement sequence and the evaluation can be controlled simply and rapidly using the adjustment arrangement, e.g. in MR experiments for imaging, spectroscopy and interventional MR, since the modifications are transferred directly into the control procedure or program which is being executed.

It has proven advantageous for the input arrangement to be fashioned is in such a way that the modifications are routed directly to the control apparatus.

A rapid entry of several values is achieved if the input arrangement includes an adjustment means for the nearly simultaneous modification of at least two parameters. In this way, the measurement sequence and the evaluation can be controlled by a joystick, which supplies two or three values from a value range simultaneously or nearly simultaneously.

According to the invention, the adjustment arrangement can modify the user parameters, whereby a processor can be allocated to them for the conversion of input parameters into control parameters.

The input of the parameters can be still further simplified and accelerated if the control arrangement includes a dual buffer in which at least parts of new data are read in during a sequence that are used during a synchronous point of a sequence for controlling. A synchronous point can for example be the end of a sequence, of an individual measurement, or a manual stop command.

It has proven advantageous for a part of the control parameters to be loaded into the dual buffer in combined form in parameter blocks, which are activated at the end of the sequence.

According to the invention, the dual buffer can be a buffer memory, or its function can be implemented as software.

A particularly simple input of the parameters results if the control arrangement is formed by a joystick, a mouse or a trackball.

The user parameters can advantageously be modified by the is adjustment arrangement if they relay the entered values to a processor that converts the values into user parameters.

In a magnetic resonance system for the production of images of arbitrarily rotated slices through a subject of examination, such user parameters can, according to the invention, be for example a rotation of the slice about two axes, a displacement of the slice, a two-dimensional modification of the image segment and/or a modification of the matrix size.

According to the invention, the adjustment arrangement can also be used for image manipulation by using them to control the windowing, whereby for example the center of a window can be selected in an image brightness axis, and the amplitude window can be selected symmetrically about this center.

DESCRIPTION OF THE DRAWINGS

The single FIGURE is a schematic block diagram of a medical diagnostic apparatus constructed and operating in accordance with the principles of the present invention.

DESCRIPTION OF THE PREFERRED EMBODIMENTS

In the FIGURE, a part of a medical diagnostic apparatus is shown, e.g. an MR installation specified on pages 479ff. of the book "Bildgebende Systeme für die medizinische Diagnostik," by Erich Krestel, comprising a control arrangement and an imaging system with a control computer 1. A gradient processor 6, an RF processor 7 and a data acquisition unit 8 are connected to the control computer 1 via a data bus 2 and memories 3 to 5. These are in turn connected in a known way with the gradient generators, RF generators, and data recorders (not shown).

Furthermore, an image computer 9 is connected to the data bus 2 connected to the control computer 1, said image computer 9 being connected to a monitor 10 for the representation of a diagnostic image.

An input arrangement 11 is connected with the control computer 1 and an image computer 9 via the data bus 2, for the entry of user parameters or, UI parameters and image manipulations via a processor 15. The input arrangement 11 can, for example be formed by, one or more of a joystick 12, a mouse 13 and/or a pushbutton or switch 14.

It is essential for the input that two values can be modified simultaneously or quasi-simultaneously. If the joystick 12 is of the type that can be pushed in or pulled out, three values can be modified at the same time. In place of a joystick 12, a mouse 13, a trackball, an acoustic (ultrasound) locator, an optical locator, or similar locators can be used.

According to the table bellow, some conversions between UI parameters and control parameters are required. For this purpose, the processor 15 is allocated to the joystick 12, the processor 15 containing, in a parameter memory 16, the programs for conversion and checking of the tolerances within which a parameter is permitted to change. A change in one of the parameters can have an influence on the limits of another parameter. The maximum displacements of the joystick 12 always represent the tolerance limits.

If the control computer 1 for the loading of the control arrangement is sufficiently fast, it can be used in multitasking operation as a joystick processor.

In the following, four alternatives are indicated for the way in which the control parameters according to the table can be loaded into the control arrangement during the measurement.

During the measurement, a complete new data set and/or programs are loaded into a dual buffer realized by means of software. At the normal end of a sequence, or at an end of a sequence forced by a stop command, a change over into the other buffer memory takes place, and the sequence with the new parameters starts automatically. For this purpose, the sequence start and the loading of the buffer memory must be synchronized. This method with a dual buffer permits not only modifications of the UI parameters but even a change of the sequence type, but however is dependent on a rapid loading mechanism.

A software dual buffer can pose runtime problems if one of the memories 3 to 5, called the "dual port memories," is accessed simultaneously by the loading processor and the control processor, and wait cycles thus arise for the control computer 1. If the dual buffers are realized in hardware, e.g. as buffer memories 17 in the processor 15, no wait cycles result.

Normally, during a measurement only a few UI parameters, and thus control parameters, change. It is then not required to load an entire sequence. It is entirely sufficient to combine a few control parameters in parameter blocks and load them. At the end of the sequence, the new parameter blocks are then activated.

The activation can take place by means of the conversion of pointers or by copying the parameter blocks loaded during the sequence, while maintaining all pointers.

This method presupposes that control values that change due to UI parameters according to the table are not reflected in the program and/or data set as constants, but rather that at these locations there are pointers to one or more parameter blocks. A modification of UI parameters then has the effect of a conversion of the UI parameters into control parameter blocks, which are then transmitted.

As a final possibility, modified control parameters can however also be loaded directly without synchronization. It is true that some images or results are then unusable. This is not a disturbance, however, if the image calculation times are small enough. This method is the fastest of all the methods discussed here to fore.

However, it must be ensured that raw data and/or images that are stored are not based on sequences with incomplete new parameters. This can be achieved by receiving the store command only at the end of the sequence, and restarting the sequence with the parameters last inputted. After the store command, no more modifications of the UI parameters may be accepted.

According to the invention, the adjustment arrangement can also be used for image manipulation by using them to control the windowing, whereby for example the center of a window can be selected in an image brightness axis, and the amplitude window can be selected symmetrically about this center.

By means of the possibility of simultaneous modification of two or three values, this input arrangement 11 is suited for various inputs.

By pushbuttons or switches 14, housed either on the joystick 12 or in a separate housing, the evaluation of the input data can be modified.

In this way, various inputs can be modified by the joystick 12. For example, the angle of rotation of a slice about two axes can be set. By pushing in or pulling out the joystick 12, a forward or rearward displacement can be achieved at the same time.

A slice can also be moved horizontally and vertically. The forward or rearward movement can take place by pushing in or pulling out the joystick 12. If this is not possible, a changeover to forward and rearward can take place via the buttons or switches 14.

The image segment (FOV) can be enlarged or reduced in two dimensions according to the invention. By pushing in or pulling out, it is in turnpossible simultaneously to carry out a forward or rearward displacement. A selection of the matrix size can also take place.

By means of the pushbuttons or switches 14, a changeover to one-dimensional input can also take place. The most important parameter of this sort is the repetition time TR. Likewise, the modification of one-dimensional values can be achieved by means of longer or shorter pushing of a button.

By button pressure or switch, the joystick 12 can also be used in image manipulation, e.g. in windowing. In order to select a window, a center is marked in an image brightness axis and an amplitude window is entered symmetrically about this center. For an asymmetrical window, a symmetrical window is first selected and a new center is determined.

According to the invention, the input arrangement 11 can also be connected to the control computer 1 directly via the data bus 2. An additional direct connection of the input arrangement 11 with the image computer 9 would also be possible.

A processor for faster conversion of the input data into user parameters can be allocated to the input arrangement 11. It can be provided either in the control computer 1, the image computer 9, in the input arrangement 11 itself or between the input arrangement 11 and the data bus 2.

By means of the inventive construction of the imaging system, one obtains an apparatus with which a rapid method can be realized for controlling the measurement sequence and the evaluation, e.g. in MR experiments for imaging, spectroscopy and interventional MR, by means of the joystick 12 or other apparatuses that supply two or three values from a value range. By means of the inventive construction of the input arrangement 11, two values can be modified simultaneously or quasi-simultaneously. If the joystick 12 also has the possibility of being pushed in or pulled out, three values can simultaneously be modified and entered.

In the inventive online MR sequence modification, modifications are brought directly into the control procedure or program currently being executed without the necessity of re-calculating the sequence control data or programs for each modification, so that MP sequences can be modified during the measurement.

The online input is important for diagnosis, and in particular for "interventional MR imaging." In "interventional MR imaging," operations in the brain, among others, can be carried out under MR observation. A joystick 12 does not have to be employed as the input arrangement 11 for these types of interventional procedures. Thus, for example, an instrument manipulator can supply the locus information concerning how far a tool, e.g. an injection needle, laser or surgical instrument, has been advanced, automatically or controlled by the surgeon. For manually guided tools, the locus coordinate sensor, e.g. an ultrasound transmitter or light-emitting diodes, can be located in the tool. For work using a manipulator, it must be possible to give the manipulator commands such as stop, start, slow, fast. However, it must also be possible to influence the MR sequence, so that as far as possible slices that are determined by the locus coordinates are shown in real time. Parallel to this, for example joystick inputs can modify the MR sequence as the slice orientation.

Parallel to the production of the sequence control data or sequence control programs, programs for the control computer 1 are generated so that it can carry out, online and in a purposive manner, small changes of the sequence control data or programs directly in the controlling.

TABLE

| UI parameters | Control parameters |
|---|---|
| Repetition and echo times TR, TI, TF | Number of passes |
| Image segment FOV (Field of View) | Number of passes Read and phase gradients, frequency offset |
| Slice thickness | Slice gradients, frequency offset Phases |
| Matrix size | Number of passes Gradients, Frequency offset Phases |
| Slice position | Frequency offset Phases |
| Slice rotation | Rotation matrix |
| Saturation slices | Frequency offset Phases Jumps Number of passes Scale values (0 or #0) |
| Automatic switchoff | Sequence stop effects ramp down gradients |

Although modifications and changes may be suggested by those skilled in the art, it is the intention of the inventor to embody within the patent warranted hereon all changes and modifications as reasonably and properly come within the scope of his contribution to the art.

What is claimed is:

1. A medical imaging system comprising:
   data acquisition means for acquiring magnetic resonance image data;
   an image computer connected to said data acquisition means for constructing a magnetic resonance image from said image data;
   a control computer connected to said image Computer and to said data acquisition means via a bus for controlling acquisition of said image data and generation of said image during a sequence execution having sequence parameters associated therewith; and
   manually operable input means, having a manually operable input unit selected from the group consisting of a joystick, a trackball and a mouse, connected to said bus for supplying at least some of said sequence parameters to said control computer, and said input means including a processor connected to said manually operable input unit, said processor being configured to respond to said sequence parameters from said manually operable input unit to directly modify at least some of said sequence parameters online during said sequence execution.

2. A medical imaging system as claimed in claim 1 wherein said input means comprises means for directly feeding modifications of at least some of said sequence parameters to said control computer.

3. A medical imaging system as claimed in claim 1 wherein said adjustment means comprises means for allowing substantially simultaneous modification of at least two values of at least some of said sequence parameters.

4. A medical imaging system as claimed in claim 1 wherein said sequence parameters include user parameters, and wherein said adjustment means comprises means for modifying said user parameters during said sequence.

5. A medical imaging system as claimed in claim 1 wherein said control computer employs control parameters for controlling acquisition of said image data and generation of said image, and wherein said adjustment comprises means for producing input parameters corresponding to modifications of at least some of said sequence parameters, and wherein said input means includes processor means for converting said input parameters into said control parameters.

6. A medical imaging system as claimed in claim 1 further comprising a dual buffer, in communication with said control computer, in which at least parts of new data acquired by said image acquisition unit are entered during acquisition of said image data, and wherein said control computer comprises means for employing said new data for controlling acquisition of said image data and generation of said image.

7. A medical imaging system as claimed in claim 6 wherein said control computer parameters for controlling acquisition of said image data and generation of said image, said control parameters being loaded into said dual buffer as parameter blocks, which are activated at an end of said sequence.

8. A medical imaging system as claimed in claim 6 wherein said dual buffer comprises a buffer memory.

9. A medical imaging system as claimed in claim 6 wherein said dual buffer comprises software means for entering said new data.

10. A medical imaging system as claimed in claim 1 wherein said adjustment means comprises means for supplying at least two values from a value range to said control computer.

11. A medical imaging system as claimed in claim 1 wherein said adjustment means comprises means for producing input values, and wherein said input means further comprises processor means for converting said input values into user parameters.

12. A medical imaging system as claimed in claim 1 wherein said sequence includes selection of a slice angle, and wherein said adjustment means comprises means for modifying said slice angle relative to two axes.

13. A medical imaging system as claimed in claim 1 wherein said sequence includes selection of a slice, and wherein said adjustment means comprises means for displacing said slice.

14. A medical imaging system as claimed in claim 1 wherein said sequence includes obtaining image data from a multi-dimensional image segment, and wherein said adjustment means comprises means for modifying said image segment two-dimensionally.

15. A medical imaging system as claimed in claim 1 wherein said sequence includes storing said image data in a data matrix, and wherein said adjustment means comprise means for modifying a size of said image matrix.

16. A medical imaging system as claimed in claim 1 wherein said adjustment means comprises means for manipulating said image.

17. A medical imaging system as claimed in claim 16 wherein said adjustment means comprises means for controlling windowing of said image.

18. A medical imaging system as claimed in claim 16 wherein said adjustment means comprise means for selecting a center of an image window along an image brightness axis and for selecting an amplitude window symmetrically around said center.

* * * * *